United States Patent [19]

Hoffmann

[11] 3,748,498

[45] July 24, 1973

[54] LOW VOLTAGE QUASI STATIC FLIP-FLOP

[75] Inventor: Kurt Hoffmann, Sunnyvale, Calif.

[73] Assignee: American Micro-Systems, Incorporated, Santa Clara, Calif.

[22] Filed: July 27, 1972

[21] Appl. No.: 275,540

[52] U.S. Cl. .................. 307/279, 307/238, 307/251, 307/291

[51] Int. Cl. .......................... H03k 3/286, H03k 3/33

[58] Field of Search .................... 307/205, 238, 246, 307/251, 279, 289, 291, 304

[56] References Cited

UNITED STATES PATENTS

| | | | |
|---|---|---|---|
| 3,363,115 | 1/1968 | Stephenson | 307/279 |
| 3,383,569 | 5/1968 | Üscher | 307/279 X |
| 3,514,765 | 5/1970 | Christensen | 307/279 X |
| 3,614,476 | 10/1971 | Teranishi | 307/279 |
| 3,624,423 | 11/1971 | Borgini | 307/279 |
| 3,629,612 | 12/1971 | Harbert | 307/204 X |

*Primary Examiner*—John W. Huckert
*Assistant Examiner*—L. N. Anagnos
*Attorney*—Roger W. Erickson

[57] ABSTRACT

An integrated circuit providing a quasi static flip-flop function that is operable by a relatively low voltage source and requires only a single clock pulse. A pair of cross-connected latch transistors are each connected through a separate node to a load device between a power source and ground. Each node is connected through a first lead containing which is gate connected to a capacitor and it is also connected through a pair of resistor elements to the same capacitor. Between each pair of resistor elements is a second lead connected to the first lead and to ground through a transistor whose gate is connected to a single clock.

10 Claims, 5 Drawing Figures

LOW VOLTAGE QUASI STATIC FLIP-FLOP

BACKGROUND OF THE INVENTION

Static flip-flops are used extensively in electronic circuitry, particularly in large-scale integrated circuits using metal oxide semiconductor (MOS) or metal insulator semiconductor (MIS) field effect transistors. Such flip-flop circuits fall generally into two categories, namely master-slave cells and quasi static binary cells and they utilize their latching circuits for dividing the frequency of input signals from cell to cell. Thus, they are particularly useful in clocking mechanisms where it is necessary to reduce the high frequency rate of a pulse generator to a lower frequency. The master-slave type of flip-flop utilizes two latches with gating for each latch to accomplish its frequency dividing while conventional quasi static binary cells have only one latch with gating plus dynamic storage elements such as capacitors. Therefore, the power consumption of quasi static flip-flops is inherently lower than that of master-slave cells. For many applications the total available power is a limiting factor and therefore minimum power consumption is a critical factor. Such is true for circuits embodied in large-scale integrated circuit semiconductor devices used for products such as watches or clocks where the power available is generally a small battery with only a limited capacity.

In large-scale integrated circuits utilizing the conventional quasi static binary cell with a single latch, two clocking phases were required in order to control the capacitive discharge necessary to operate the latch. Implemenation of this cell in an integratd circuit device of the MOS type will function properly only if the clock voltage is greater than twice the threshold voltage of the MOS transistor plus the body effect voltage. Since the clock voltage depends on the power supply voltage, the quasi static binary cell can only be used if enough power supply voltage is available. Thus, in order to reduce the power implementation voltage, the clock voltage requirement must be lower. The present invention solves this problem.

A general object of the present invention is to solve or alleviate the aforesaid problem by providing a flip-flop circuit requiring less power to operate than the conventional flip-flop circuits heretofore used.

Another object of the present invention is to provide a quasi static binary cell flip-flop that is particularly adaptable for embodiment in large-scale integrated circuit semiconductor structures for devices that require a lower power consumption.

Another object of the present invention is to provide a quasi static flip-flop that is adaptable for implementation as an integrated circuit semiconductor device utilizing MOS transistors wherein only one clock source is utilized for operation and the required clock voltage may be relatively low and yet sufficiently large with respect to the MOS transistor voltage in the circuit to assure proper operation with a relatively low power source.

Another object of the present invention is to provide a quasi-static binary cell flip-flop circuit that can utilize depletion mode devices whose resistance can be varied to improve the operation of the circuit.

Other objects, advantages and features of my invention will become apparent from the following detailed description present in conjunction with the accompanying drawings.

SUMMARY OF THE INVENTION

In broad terms, the present invention is characterized by a quasi-static flip-flop circuit wherein a pair of cross-connected transistors are connected between a power source ($V_{DD}$) and ground. Each latch transistor is connected to a load device through a node or junction which is also connected to a capacitor. Between each capacitor and its junction are a pair of resistor elements such as depletion mode MOS devices. Connected to another junction between these resistor devices is a lead to ground through a transistor whose gate is connected to a single phase clocking source. In operation, when one node is at Vhd DD potential with its connected capacitor charged over the resistors a clock pulse applied to a clocking transistor will switch the latch into its opposite state because the capacitor is simultaneously producing a voltage on a transistor that affords a current path to ground. Now, the other capacitor cannot be immediately charged since its connected resistors are also connected to the other clocking transistor. However, when the clock pulse is temporarily removed the second capacitor becomes charged to the $V_{DD}$ potential so that the next clock pulse will switch the latch over into its opposite state. The resulting output of the circuit is a modified square wave pulse at one half the frequency of the clocking frequency.

DETAILED DESCRIPTION OF EMBODIMENTS

Figures 1, 2:
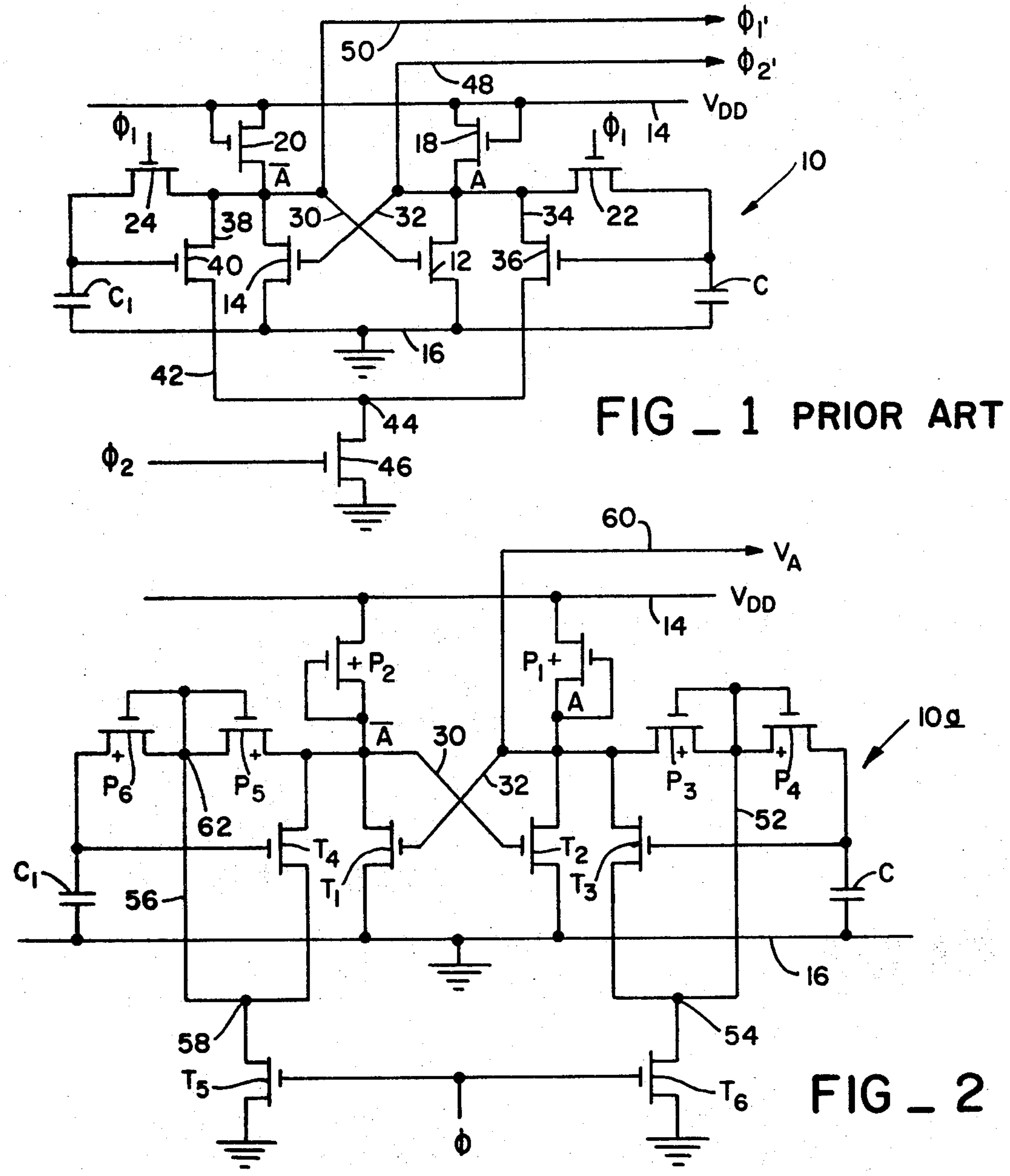
FIG 1 PRIOR ART, FIG 2
FIG. 1 is a circuit diagram of a conventional quasi-static binary cell flip-flop utilizing two clocks.
FIG. 2 is a circuit diagram of a quasi-static binary cell flip-flop circuit utilizing one clock and embodying the principles of the present invention.

Referring to the drawing, FIG. 1 shows a conventional quasi static binary cell 10 as it appears when implemented as an integrated circuit using MOS or MIS field effect transistors. This cell has a single latch and requires two separate alternating clock pulses $\phi_1$ and $\phi_2$ for operation. The latch is comprised of a pair of transistors 12 and 14 whose drain terminals are each connected to junctions designated A and $\bar{A}$ respectively and whose source terminals are connected to a common ground line 16. The junctions A and $\bar{A}$ are in turn connected to load transistors 18 and 20 respectively, both of which have gate and drain terminals connected to a Vhd DD power line 14 supplying a power at a constant level. The junctions or nodes A and A' are connected through a pair of clocking transistors 22 and 24 respectively which are in turn connected to a pair of capacitors C and $C_1$. The other side of each capacitor is connected to the common ground line 16. The junction $\bar{A}$ is also connected by a lead 30 to the gate of transistor 12 and the junction A is connected by a lead 32 to the gate of transistor 14 to form the latch. Between the junction A and the clocking transistor 22 is a lead 34 connected to the drain of a transistor 36, and similarly between the clocking transistor 24 and the junction $\bar{A}$ is a lead 38 connected to the drain of a transistor 40. The source of these transistors 36 and 40 are connected by a lead 42 to a common junction 44 which is connected to the drain of a third clocking transistor 46 whose source is connected to ground. Leads 48 and 50 extending from the nodes A and $\bar{A}$ respectively supply clock pulses to the next binary cell of a series in a typical frequency deviding circuit. In this circuit the phase one ($\phi_1$) clock is supplied simultaneously to the transistors 22 and 24 while a phase two ($\phi_2$) clock is applied to the gate of transistor 46. When a $\phi_1$ clock pulse is present on transistors 22 and 24 capacitors C, $C_1$ are charged in accordance with the existing latch condition. When the $\phi_2$ clock pulse occurs as $\phi_1$ is turned off, the voltage of either capacitor 26 and 28 causes the latch to conduct through the other transistor (36 or 40).

In order for this quasi static binary cell of FIG. 1 to function properly when circuit 10 is implemented by MOS circuitry, the clock voltage $\phi_1$ must be greater than two times the threshold voltage ($V_T$) of the MOS transistors 22 and 24 plus the body effect voltage. This is a well known characteristic of MOS devices. Thus, since the clock voltage $\phi_1$ depends on the power supply voltage ($\phi_{1\ MAX} = V_{DD}$) the quasi static binary cell can only be used if sufficient power supply voltage is available.

Now, turning to FIG. 2, a circuit **10*a*** is shown which accomplishes the required frequency dividing function, yet eliminates the need for two clock phases and thereby allows operation at a significantly reduced level of power.

In circuit **10*a* the clocking transistors 22 and 24 are eliminated and replaced by pairs of resistor elements $P_3$, $P_4$ and $P_5$, $P_6$, respectively. The load devices 18 and 20 are similarly designated as $P_1$ and $P_2$ since they are also essentially resistor elements. In this circuit $P_1 = P_2$; $P_3 = P_5$; and $P_4 = P_6$. In the example shown $P_1$ and $P_2$ are equal in value to $P_3$ and $P_5$ although this relationship is not essential for operation of the circuit. Preferably, all of these resistor elements $P_1 - P_6$ are depletion mode transistor devices when the circuit is implemented in MOS semiconductor structure, although other forms of resistor elements could be utilized. Thus, between the junction A and the capacitor C, are a pair of depletion mode transistors $P_3$ and $P_4$ and between the junction $\bar{A}$ and capacitor $C_1$ are a pair of depletion mode devices $P_5$ and $P_6$. The gates of transistors $P_3$ and $P_4$ are connected by a lead 52 to a junction 54 which is also connected to the source terminal of a transistor $T_3$. In a similar manner, the gates of transistors $P_5$ and $P_6$ are connected by a common lead 56 to a junction 58 which is also connected to the source of a transistor $T_4$. The junction 54 is also connected to the drain of a transistor $T_6$ whose source is connected to ground, while the junction 58 is connected to a transistor $T_5$ whose source is similarly grounded. The gates of these transistors $T_5$ and $T_6$ are both connected to a single clock source $\phi$. In this circuit the latching transistors are designated as $T_1$ and $T_2$. The latching transistor $T_2$ is connected to the ground line 16 and through the junction A to the device $P_1$ which is connected to the $V_{DD}$ power line 14. The other latching transistor $T_1$ is connected through the junction $\bar{A}$ to the device $P_2$ in series between the ground and power lines 14 and 16. The output ($V_A$) of the circuit 10*a* is a pulse at essentially one half the frequency of the input clock rate ($\phi$) and is provided in a lead 60** extending from the node A. If an inverted output is required it is obtained from the node $\bar{A}$.

Figure 3:
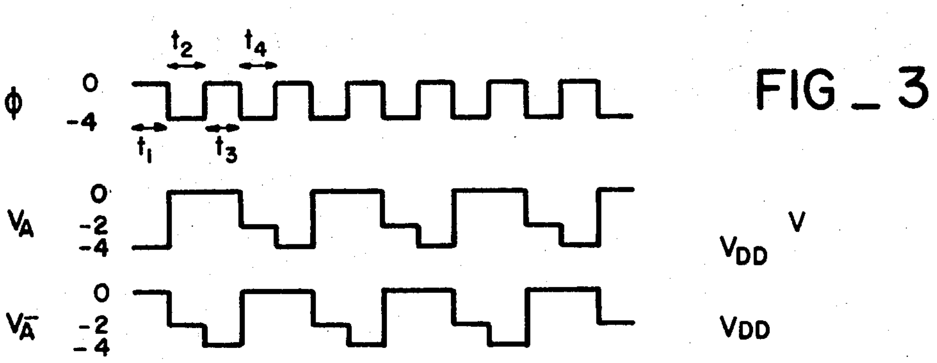
FIG. 3 is a timing diagram for the circuit of FIG. 2.

The operation of circuit **10*a* in FIG. 2 may be readily understood by reference to the timing diagrams of FIG. 3. The upper portion of FIG. 3 represents the input clocking signals $\phi$ which are continuous square wave pulses at a given frequency. Assume that during an initial time interval $t_1$(FIG. 3) a negative voltage (e.g., −4 volts) is provided in the $V_{DD}$ power line 14, with the latch in an initial state with node A at $V_{DD}$ potential and the capacitor C charged over $P_3$ and $P_4$. At this time interval ($t_1$), with no clock pulse present, node A is at a −4 volt potential and node $\bar{A}$ is at zero potential because the node A voltage is applied by lead 32 to the gate of the latch transistor $T_1$ which thus provides a current path to the ground lead 16. Now, when the first clock pulse $\phi$ is provided on the transistors $T_5$ and $T_6$, indicated as time interval $t_2$ on FIG. 3, a current path is provided through the pull-up device or load transistor $P_1$, through the transistor $T_3$ whose gate is activated by the charge from the capacitor C, and through the transistor $T_6$ to ground. This pulls the potential at node A to zero or ground. Thus, in FIG. 3, the value of $V_A$ at this point is shown as zero. At node $\bar{A}$, a current path exists through the pull-up transistor $P_2$, the resistor device $P_5$, and through lead 56 and the transistor $T_5$ to ground. Since there is in time interval, $t_2$, no charge on the capacitor $C_1$ the gate on transistor $T_4$ is not activated so current flow cannot occur through it but current flows through resistor $P_5$. Resistor $P_5$ is selected to have the same resistance as the pull-up device $P_2$ and therefore the potential at node $\bar{A}$ will drop to −2 volts (in the example shown). However, the potential at the junction 62 between the resistors $P_5$ and $P_6$ and at the capacitor $C_1$ remains at zero because of the current path to ground through lead 56** and the clocking transistor $T_5$.

Now, at time interval t3 the clock pulse $\phi$ returns to zero, deactivating the gates of transistors $T_5$ and $T_6$. This prevents a current path through lead 56 and causes the full $V_{DD}$ potential of −4 volts to occur at node $\bar{A}$ and to charge the capacitor $C_1$ at this same potential. This same voltage from junction $\bar{A}$ is also applied to the gate of the latch transistor $T_2$ thereby activating it and providing a current path to ground and causing node A to remain at zero potential.

At time interval *t4* in FIG. 3, the clock pulse again occurs to activate the gates of transistors $T_5$ and $T_6$. At this instant, the capacitor $C_1$ discharges through the resistor $P_6$, the lead 56 and the transistor $T_5$ to ground. However, its decay time is much greater than the latching time so that before discharging it first activates the gate of the transistor $T_4$ thereby providing a current path to ground and causing node $\bar{A}$ to go to zero potential. At node A a current path now occurs through $P_1$, $P_3$, the lead 52 and the transistor $T_6$ to ground. Since the resistor $P_3$ is the same value as the pull-up device $P_1$, the potential at node A is at one half the $V_{DD}$ potential or −2 volts at time interval t4.

Thus, as shown, when the clocking pulses are provided at a frequency *f* the outputs $V_A$ or $\bar{V}_A$ are provided at one half the clock input frequency $\phi$, so that frequency dividing has been accomplished with but a single clock input.

If the circuits **10*a*** are cascaded, that is, if the output voltage VA or V$\bar{A}$ is used as the clock voltage $\phi$ for the next flip-flop or circuit, the value of this voltage at the time interval $t1$ is $\phi = VA = V_{DD}$ (P5/P2 + P5 )

Figure 4:
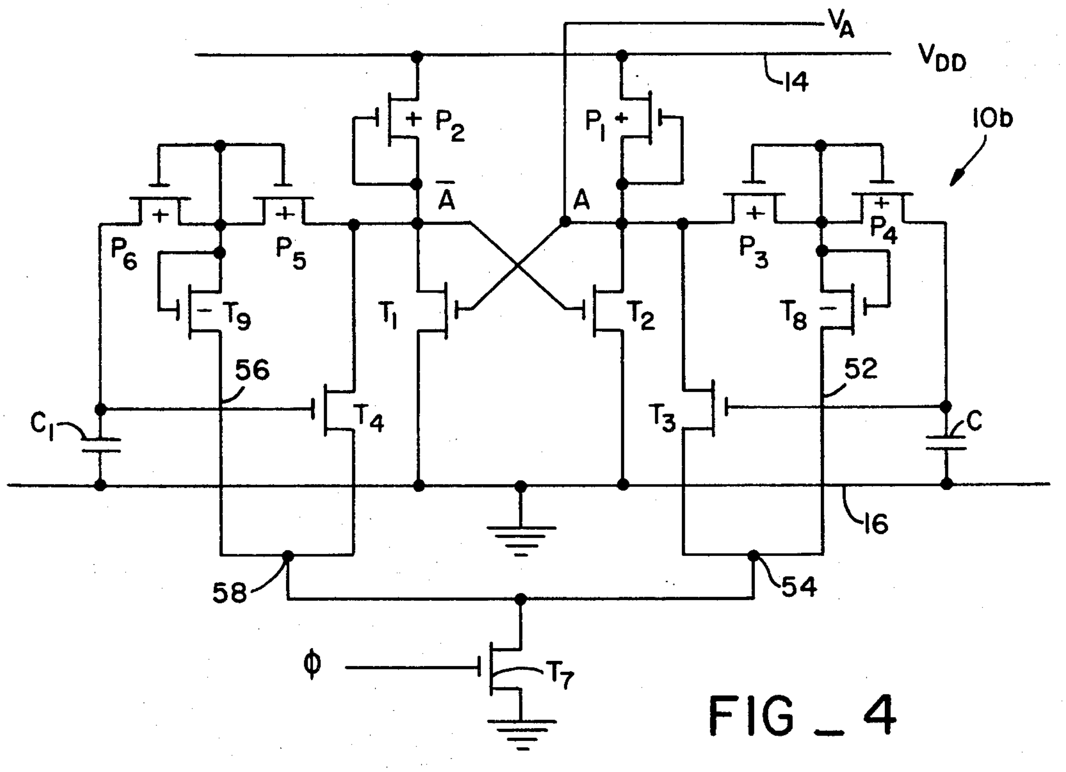
FIG. 4 is a circuit diagram showing another form of quasi-static binary cell flip-flop according to the present invention.
Figure 5:
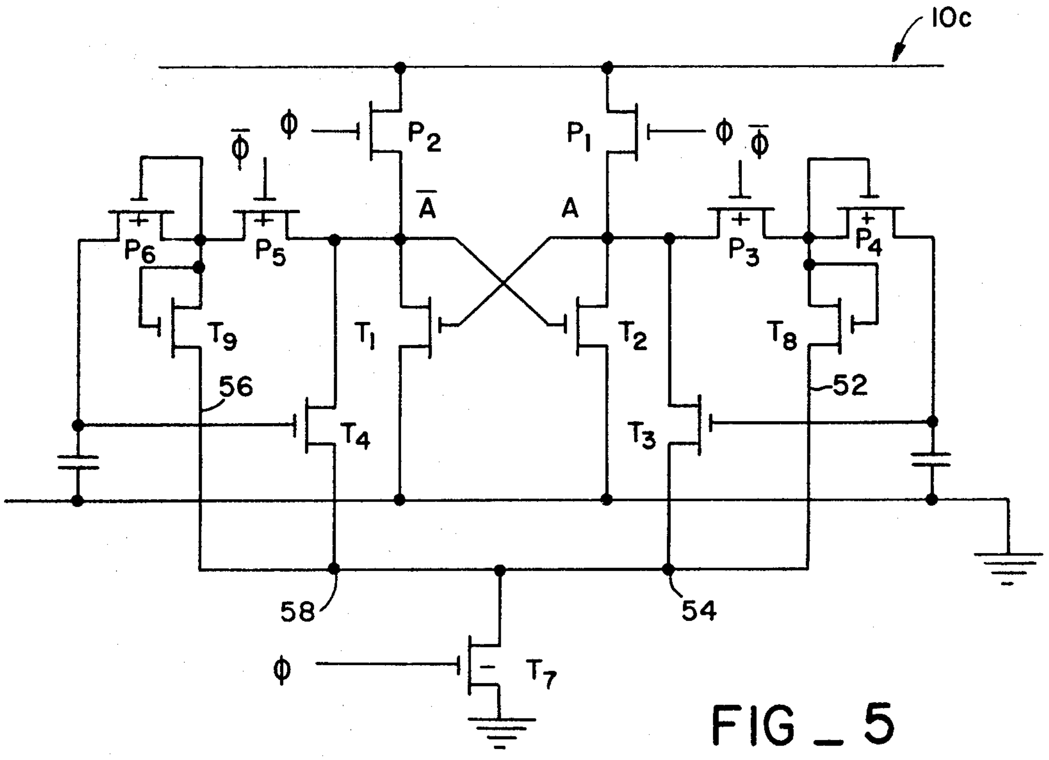
FIG. 5 is a circuit diagram of yet another form of quasi-static flip-flop embodying the principles of the present invention.

In order to increase the output voltage VA in the time interval and thereby reduce the jog or step in the outputs VA or $\overline{V}$A of the circuit, a modified circuit 10*b* is provided, as shown in FIG. 4. Here, a pair of transistors $T_8$ and $T_9$ are provided in the leads 52 and 56 respectively. Thus, the transistor $T_8$ is connected by the lead 52 from a junction between the resistor elements $P_3$ and $P_4$ to the junction 54, while the transistor $T_9$ is provided between the junction 58 and a junction between the resistor elements $P_5$ and $P_6$. Both of these transistors $T_8$ and $T_9$ serve to increase the discharge time of the capacitors C and $C_1$ while also providing additional voltage drop of $V_T$in leads 56 and 58 respectively. Thus, now in the time interval $t2$ applying standard circuit formulae, the output voltage VA equals $V_T$ (1− [P5/P2 + P5 ]) + $V_{DD}$ (P5/P2 + P5), where $V_T$ is the threshold voltage of the transistors $T_9$ or $T_8$, while in the time interval t3 the voltage VA = $V_{DD}$. When the additional voltage drop of transistors $T_9$ is added to that of $P_5$ in this formula it is seen that the resulting total voltage of nodes A and $\overline{A}$ increases. In effect, this modification increases the voltage at each output node of the latch at the intermediate clock intervals $t$2 and $t$4, thereby reducing the size of the "step" in the output pulse.

A further increase in output voltage is possible in another modified circuit 10*c* utilizing the principles of my invention. In this embodiment the depletion mode devices $P_1$ and $P_2$ are clocked by the normal clock pulse $\phi$, the devices $P_3$ and $P_5$ are clocked by the inverted clock pulse $\overline{\phi}$. One known characteristic of a depletion mode MOS device is that an application of a voltage to its gate will decrease its resistance value. Thus, in the circuit 10*c*, the application of the clock voltage to the gate of $P_1$ as shown causes its resistance to be considerably smaller than $P_3$ and the resistance of $P_2$ to be considerably smaller than $P_5$. Using the same circuit formula, it is apparent that the output voltage VA will approach the value of $V_{DD}$ that is, with $P_5 >> P_2$ and $P_3 >> P_1$. The output voltage $V_A$ in time interval $t_2$ will equal approximately $V_T$(1 − [ P5/P5]) + $V_{DD}$ P5/P5 = $V_{DD}$. This further tends to eliminate the jog in the output pulses $V_A$ and $V_{\overline{A}}$ which are applied to the next cell in a frequency dividing circuit as shown in FIG. 3.

As described by the foregoing, the present invention essentially provides a quasi-static flip-flop circuit wherein the resistance network comprised of elements $P_3$, $P_4$ and $P_5P_6$ provides a charging function for the capacitors $C_1$ and C and a delaying discharge function for these capacitor elements. This unique delaying function enables the transistor latch to switch before the charged capacitor in each cycle is fully discharged, thereby eliminating the necessity for the relatively higher voltage level for clocking as heretofore required for the switching network in the prior art quasi-static circuit, shown in FIG. 1.

Accordingly, it is apparent that the present invention provides a circuit readily adaptable for implementation in an integrated circuit MOS semiconductor structure and which can provide a frequency dividing function with very little power and in a less complicated manner than circuits of the prior art. Because of these latter features this invention is particularly useful when implemented in semiconductor devices for use in watches and other apparatus where available power is extremely limited.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A quasi-static flip-flop circuit comprising:

a pair of latch transistors, each connected at one terminal to ground and at another terminal to one of a pair of junctions and means cross-connecting their gates to said junctions;

a pair of load devices each inter-connecting one said latch transistor with a power source;

a pair of capacitors, each connected between one said junction and ground;

two pairs of resistive elements, each pair being connected in series between one said capacitor and its connected junction;

a pair of first lead members, each connected to one said junction and a pair of second lead members each connected to a terminal between one said pair of resistive elements;

a pair of switching transistors, each being source-drain connected in one of said first lead members and means connecting the gate of each said switching transistor to one of said capacitors;

lead means for connecting said first and second lead members to ground;

switching means in said lead means and a single phase clocking pulse means connected to said switching means for operating said circuit.

2. The circuit as described in claim 1 wherein said resistive elements are depletion mode MOS transistor elements.

3. The circuit as described in claim 1 wherein said resistive elements all have the same resistance value.

4. The circuit as described in claim 1 including an auxiliary resistive element in each of said second lead members between a terminal, between a pair of resistor elements and said lead means.

5. The circuit as described in claim 4 wherein each said auxiliary resistive element is an MOS transistor.

6. The circuit as described in claim 1 wherein at least one of each said pair of resistive elements is a depletion mode MOS device whose gate is connected to the inversion of said clocking pulse means.

7. The circuit as described in claim 6 wherein said lead means is a single lead member connected to ground and containing a source-drain connected transistor whose gate is connected to said clocking pulse means.

8. The circuit as described in claim 4 wherein one of each said pair of resistive elements is an MOS transistor whose gates are connected to an auxiliary clocking voltage for varying their resistance value.

9. An MOS quasi-static flip flop circuit comprising:

a pair of latch transistors, each connected at one terminal to ground and at another terminal to one of a pair of junctions and means cross-connecting their gates to said junctions;

a pair of load transistors each inter-connecting one of said latch transistors with a power source;

a pair of capacitors, each connected between one said junction and ground;

a pair of resistive means each being connected between one said capacitor and its connected junction;

a pair of first lead members, each connected to one of said pair of junctions and to a second junction means and containing a switching transistor whose gate is connected to one of said capacitors;

a pair of second lead members each connected to one of said resistive means and to said second junction means and thereby providing a means for delaying the discharge of the capacitor so that the connected switching transistor will enable operation of the latch transistors;

means for connecting said second junction means to ground and containing a switching means connected to a clocking pulse means for operating said circuit.

10. The circuit as described in claim 9 wherein each said resistive means comprises a pair of depletion mode MOS transistor elements, and a load transistor connected in each said second lead member.

* * * * *

UNITED STATES PATENT OFFICE
CERTIFICATE OF CORRECTION

Patent No. 3,748,498 Dated July 24, 1973

Inventor(s) KURT HOFFMANN

It is certified that error appears in the above-identified patent and that said Letters Patent are hereby corrected as shown below:

First page, line 7 of Abstract, after "containing" insert --a transistor--. Column 2, line 14, "Vhd DD" should read --$V_{DD}$--; line 56, "Vhd DD" should read --$V_{DD}$--. Column 5, line 2, insert --and at time interval t2 it is $\emptyset = V_{DD}$-- after "(P5/P2 + P5)".

Signed and sealed this 18th day of December 1973.

(SEAL)
Attest:

EDWARD M. FLETCHER, JR.
Attesting Officer

RENE D. TEGTMEYER
Acting Commissioner of Patents